United States Patent [19]

Higashi

[11] 4,445,052
[45] Apr. 24, 1984

[54] TTL INPUT CURRENT REDUCTION CIRCUIT

[75] Inventor: Norikuni Higashi, Kawasaki, Japan

[73] Assignee: Fujitsu Limited, Kawasaki, Japan

[21] Appl. No.: 184,362

[22] Filed: Sep. 5, 1980

[30] Foreign Application Priority Data

Sep. 7, 1979 [JP] Japan .................. 54-114999

[51] Int. Cl.³ .................... H03K 19/088; H03K 19/20
[52] U.S. Cl. .................... 307/456; 307/443; 307/446
[58] Field of Search ............... 307/445, 458, 446, 443, 307/456, 457

[56] References Cited

U.S. PATENT DOCUMENTS

| | | | |
|---|---|---|---|
| 3,553,486 | 1/1971 | Dow | 307/457 X |
| 3,699,362 | 10/1972 | Jordan | 307/456 X |
| 3,769,524 | 10/1973 | Mathews | 307/458 X |
| 3,769,530 | 10/1973 | Kalb et al. | 307/456 X |
| 4,311,927 | 1/1982 | Ferris | 307/456 X |

OTHER PUBLICATIONS

IBM Technical Disclosure Bulletin, vol. 19, No. 1, Jun. 1976, pp. 142-143, New York.
Electronique Industrielle, No. 125, Jul./Aug. 1969, pp. 484-487.
IBM Technical Disclosure Bulletin, vol. 18, No. 11, Apr. 1976, pp. 3639-3640, New York.
Computer Design, vol. 11, No. 10, Oct. 1972, pp. 79-86.

Primary Examiner—Larry N. Anagnos
Assistant Examiner—David R. Hudspeth
Attorney, Agent, or Firm—Staas & Halsey

[57] ABSTRACT

A multi-input logic circuit comprises a multi-emitter transistor having emitters which are connected to a logic input terminals of the multi-input logic circuit, a PNP type transistor having a base which is connected to a collector of said multi-emitter transistor and a level shift element which is connected to an emitter of the PNP type transistor. This arrangement facilitates the maintenance of an improved margin of threshold voltage to input voltage.

21 Claims, 5 Drawing Figures

TTL INPUT CURRENT REDUCTION CIRCUIT

FIELD OF THE INVENTION

The present invention relates to a logic circuit device which has a multi-emitter transistor as an input stage, and which is manufactured as a large scale integrated (LSI) circuit.

BACKGROUND OF THE INVENTION

A large scale integrated circuit includes a great number of circuit elements in a very small space. Therefore, a process for manufacturing the large scale integration circuit is very complex and requires a large amount of time. Recently, a process called the master slice method was developed. In the master slice method, the processes carried out before the formation of the wiring by metallic evaporation are commonly carried out for many circuits. Only the final wiring process, such as an aluminium evaporation, is different, depending on the circuit to be formed.

One example of a transistor-transistor logic (hereinafter called TTL) circuit which is manufactured by the master slice method is disclosed in an article entitled "TTL 500-gate Master Slice LSI (MB 15000 Series)", by Norikuni Higashi et al, FUJITSU, Vol. 30, No. 1, pp 185~208. In the TTL circuit disclosed in the article, a multi-emitter transistor is used as the input stage. In this TTL circuit, when at least one of the input levels of the multi-emitter transistor becomes low by receiving an input logic signal, the multi-emitter transistor is placed in a conductive state and a large current flows in a collector of the multi-emitter transistor, so that a large emitter current flows in the multi-emitter transistor.

In the master slice method, when an LSI having numerous gates (such as more than 500), is manufactured by using a conventional TTL, and when the input level becomes low, a voltage drop in the input wiring connected to the emitter becomes large due to the large emitter current in the multi-emitter transistor. Further, since normally 0.35 V is used as a low level logic input and more than 1 V is used as a high level logic input, about 0.65 V is used as a threshold voltage. However, if a voltage drop in the input wiring portion is large, the difference between the low level logic input of the circuit and the threshold voltage becomes small.

FIG. 1 of the drawings depicts a conventional TTL circuit which includes a multi-emitter transistor $Q_1$ having emitters connected to input terminals A, B . . . N, an output transistor $Q_2$ having a collector connected to an output terminal (OUT), resistors $R_1$, $R_2$, $R_3$ which are connected between an electric source terminal (VCC) and respectively the base of the multi-emitter transistor $Q_1$ a connection point between the collector of the multi-emitter transistor $Q_1$ and the base of the output transistor $Q_2$; and the collector of the output transistor $Q_2$.

In the conventional TTL circuit illustrated in FIG. 1, if at least one of the logic input levels A, B, . . . , N becomes low due to an input signal, the transistor $Q_1$ is placed in a conductive state and a large collector current flows in the transistor $Q_1$ via the resistor $R_2$, so that a large current flows in the emitter of the transistor $Q_1$.

If a master slice having many gates (such as more than 500 gates) is manufactured by using a conventional TTL illustrated in FIG. 1, when the input logic level becomes low, the voltage drop in the input wiring connected to the emitter becomes large due to the large emitter current in the multi-emitter transistor $Q_1$. Further, since normally 0.35 V is used as a low level logic input and more than 1 V is used as a high level logic input, it is desirable that approximately 0.65 V be used as a threshold voltage. However, if a voltage drop in the input wiring is large, the difference, i.e., the margin, between the low level logic input of the circuit and the threshold voltage becomes small.

OBJECTS AND SUMMARY OF THE INVENTION

An object of the present invention is to provide a logic circuit device in which the maintenance of the margin of the threshold voltage to the input level is improved.

Another object of the present invention is to provide a logic circuit device having a multi-emitter transistor in which the emitter current is very small when the multi-emitter transistor is in the conductive state so as to keep the voltage drop in the input wiring portion very small.

A further object of the present invention is to provide a logic circuit device which is suitable for a large scale integrated circuit having a great number of gate circuits.

The above-mentioned objects can be achieved by logic circuit device which comprises a multi-emitter transistor having emitters connected to a logic input terminal, a PNP type transistor as a regulating means having a base which is connected to the collector of said multi-emitter transistor and a level shift element which is connected to the emitter of the PNP type transistor.

Further features and advantages of the present invention are apparent from the following description with reference to the accompanying drawings to which, however, the scope of the invention is in no way limited.

DETAILED EXPLANATION OF THE PREFERRED EMBODIMENTS OF THE INVENTION

Figure 1:
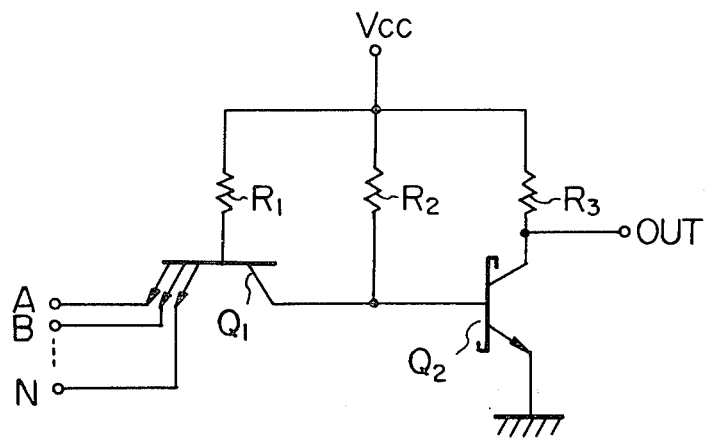
FIG. 1 is one example of a circuit of a conventional logic circuit device.
Figure 2:
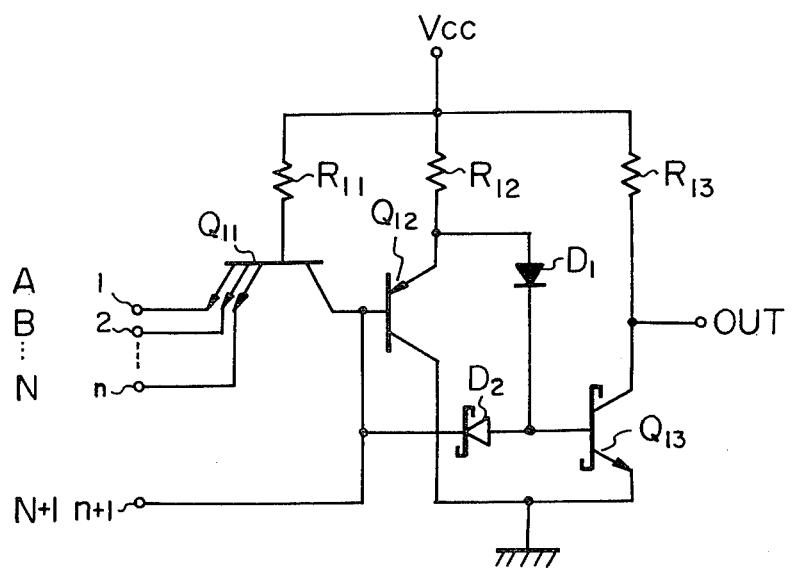
FIG. 2 is a schematic of a logic circuit device according to one embodiment of the present invention.

FIG. 2 is a schematic of a multi-input logic circuit in accordance with one embodiment of the present invention. Referring to FIG. 2, input signals A, B, . . . , N are applied to input terminals 1, 2, . . . , n which are connected to corresponding emitters of an NPN type multi-emitter transistor $Q_{11}$, the base of the multi-emitter transistor $Q_{11}$ is connected via a resistor $R_{11}$ to an electric source terminal $V_{CC}$, and the collector of the multi-emitter transistor $Q_{11}$ is connected to the base of a PNP type transistor $Q_{12}$, which is used as a regulating means. The emitter of transistor $Q_{12}$ is connected via a resistor $R_{12}$ to the electric source terminal $V_{CC}$ and the collector is connected to ground. The emitter of the transistor $Q_{12}$ is connected to the anode of the diode $D_1$, which is used as a level shift element. The cathode of the diode $D_1$ is connected to the base of transistor $Q_{13}$. The emitter of $Q_{13}$ is connected to ground, so that the diode $D_1$ and the base-emitter junction of the transistor $Q_{13}$ are connected in series between the electric terminal source $V_{CC}$ and ground. The collector of the transistor $Q_{13}$ is connected via a resistor $R_{13}$ to the electric source terminal $V_{CC}$ and to an output terminal OUT. The base of transistor $Q_{13}$ is also connected to the anode of a Schottky barrier diode $D_2$. The cathode of diode $D_2$ is connected to the base of the transistor $Q_{12}$ and the collector of the transistor $Q_{11}$.

In the circuit illustrated in FIG. 2, if at least one of the inputs A, B, ..., N becomes low, a base current flows through transistor $Q_{11}$, which is placed in a conductive state. In this case, the collector current of transistor $Q_{11}$ is supplied via the base of the transistor $Q_{12}$. The base current $I_B(Q_{12})$ of the transistor $Q_{12}$ can be expressed as: $1/\beta(Q_{12})$ of the emitter current $I_E(Q_{12})$, where $\beta(Q_{12})$ is a current amplification factor of the transistor $Q_{12}$. The value of $\beta(Q_{12})$ is about 10. Further, the base current $I_B(Q_{11})$ of transistor $Q_{11}$ can be expressed as $1/\beta(Q_{11})$ of the collector current $I_C(Q_{11})$. The collector current $I_C(Q_{11})$ is equal to the base current $I_B(Q_{12})$. Base current $I_B(Q_{12})$ of the transistor $Q_{12}$ can be expressed as:

$$\frac{I_E(Q_{12})}{\beta(Q_{12})}$$

$\beta(Q_{11})$ is the current amplification factor of the transistor $Q_{11}$ and the value of $\beta(Q_{11})$ is about several tens. Therefore, a very small current $I_B(Q_{11})$, which is given by the following equation, flows through the base of the transistor $Q_{11}$ $$I_B(Q_{11}) = \frac{I_E(Q_{12})}{\beta(Q_{11}) \cdot \beta(Q_{12})}$$

Since the collector current $I_C(Q_{12})$ of the transistor $Q_{11}$ is $1/\beta(Q_{12})$ of the emitter current $I_E(Q_{12})$ of the transistor $Q_{12}$, the emitter current $I_E(Q_{11})$ of the transistor $Q_{11}$ is very small.

When at least one of the input levels A, B, ... N is low, that is, when the transistor $Q_{11}$ is in the conducting state, the transistor $Q_{12}$ is also in the conducting state and, therefore, the emitter of the transistor $Q_{12}$ is at the low logic level, so that the transistor $Q_{13}$ is placed in the non-conducting state. Diode $D_1$ is provided for placing transistor $Q_{13}$ in the off state when the transistor $Q_{12}$ is in the conductive state and for causing transistor $Q_{13}$ to be conductive when transistor $Q_{12}$ is in the non-conductive state. When the transistor $Q_{13}$ is in the non-conductive state, the output terminal OUT is at the high level. When all inputs A, B, ... C are high, the transistor $Q_{11}$ is in the non-conductive state, and the transistor $Q_{12}$ is also in the non-conductive state and, therefore, the logic level of the base of the transistor $Q_{13}$ via the resistor $R_{12}$ and the diode $D_1$ is high, so that the output terminal OUT of the transistor $Q_{13}$ is at the low logic level. The multi-input logic circuit illustrated in FIG. 2 is operated as a positive logic NAND gate circuit. During this operation the charges which are stored in the base of the transistor $Q_{13}$ when transistor $Q_{11}$ is non-conducting and transistor $Q_{13}$ is conducting are discharged to the transistor $Q_{11}$ by the Schottky barrier diode $D_2$ when transistor $Q_{11}$ is placed in the conductive state. Thus transistor $Q_{13}$ is rapidly placed in the non-conductive state.

As mentioned above, according to the present invention, when at least one of the logic inputs A and B is at the low logic level, the emitter current of transistor $Q_{11}$ is small, so that the voltage drop between the logic circuit input terminals and the emitters of transistor $Q_{11}$ is small. Therefore, the margin between the threshold voltage and the low level logic input does not become small.

Further, according to the embodiment shown in FIG. 2, input terminal n+1 which receives logic input N+1 is connected to the base of the transistor $Q_{12}$. When the logic input N+1 is at the low logic level, even if the logic inputs A, B, ..., N are high level, the base current, which is $1/\beta(Q_{12})$ of the emitter current $I_E(Q_{12})$ of transistor $Q_{12}$, flows through the input terminal n+1, so that transistor $Q_{13}$ is placed in the non-conductive state and a high logic level appears at the output terminal OUT. When all logic inputs A, B, ... N and N+1 are at the high logic level, transistor $Q_{12}$ is non-conductive and the transistor $Q_{13}$ is conductive. Thus, a low logic level appears at the output terminal OUT. Therefore, the embodiment illustrated in FIG. 2 operates as the NAND gate also with respect to input N+1 as well as inputs A, B, ... N.

A threshold voltage for each input terminal of the circuit illustrated in FIG. 2 can be obtained as illustrated below.

Assuming that $V_{BE}(Q_{13})$ denotes the voltage between the base and the emitter of transistor $Q_{13}$, $V_F(D_1)$ denotes the forward voltage drop of diode $D_1$, $V_{BE}(Q_{12})$ denotes the voltage between the base and the emitter of transistor $Q_{12}$, and $V_{CES}(Q_{11})$ denotes the voltage between the collector and the emitter of transistor $Q_{11}$, the threshold voltage $V_{th}(n+1)$ at terminal n+1 can be obtained by the following equation:

$$V_{th}(n+1) = V_{BE}(Q_{13}) + V_F(D_1) - V_{BE}(Q_{12})$$

wherein, as $V_{BE}(Q_{13}) = V_F(D_1) = V_{BE}(Q_{12})$
therefore, $V_{th}(n+1) = V_{BE}(Q_{13})$
Further, the threshold voltage $V_{th}(1, 2, \ldots n)$ at terminals 1 or 2 can be obtained by the following equation:

$$V_{th}(1, 2, \ldots, n) = V_{th}(n+1) - V_{CES}(Q_{11})$$

wherein $V_{CES}(Q_{11}) = 0.1$ (V)
therefore $V_{th}(1, 2, \ldots, n) = 0.75 - 0.1 = 0.65$ V As mentioned above, the threshold voltage at input terminals (1, 2, ..., n) is different from the threshold voltage at input terminal (n+1). That is, the threshold voltage at terminal n+1 is larger than the threshold voltage to the terminals (1, 2, ..., n). Therefore, when a flip-flop circuit is constructed by using the circuit shown in FIG. 2, if a clock pulse signal is applied to terminal (n+1), this clock pulse signal is not influenced by the noise signal introduced from the outside because the threshold voltage to the terminal (n+1) is high. Therefore, a stable flip-flop circuit can be constructed.

Figure 3A:
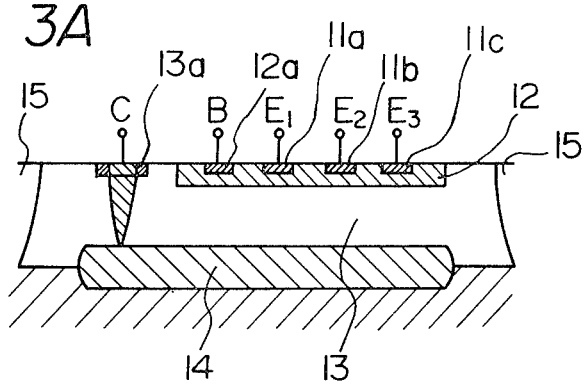
FIG. 3A is a cross sectional view of a multi-emitter transistor used in the circuit illustrated in FIG. 2.
Figure 3B:
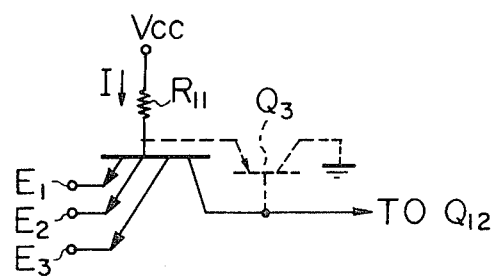
FIG. 3B is an equivalent circuit schematic of the multi-emitter transistor illustrated in FIG. 3A.

FIG. 3A is a cross section of the multi-emitter transistor $Q_{11}$ formed as an integrated circuit. In FIG. 3, 11a, 11b, and 11c denote emitters, 12 denotes a base region, 12a denotes a contact of the base region 12, 13 denotes a collector region, 13a denotes a contact of the collector region 13, 14 denotes a buried layer and 15 denotes isolation regions. In the multi-emitter transistor illustrated in FIG. 3A, a parasitic lateral PNP transistor is formed by the base region 12, the collector region 13 and the isolation region 15. The equivalent circuit of the parasitic PNP transistor is illustrated in FIG. 3B by dotted lines and identified by reference numeral $Q_3$. As the base cut off of the transistor $Q_{12}$ is determined by a current supplied from the resistor $R_{11}$, the current supplied to the base of transistor $Q_{12}$ is determined by the current $I/\beta(Q_3)$. Therefore, the operating speed of the circuit is decreased by the effect of the parasitic lateral transistor.

Figure 4:
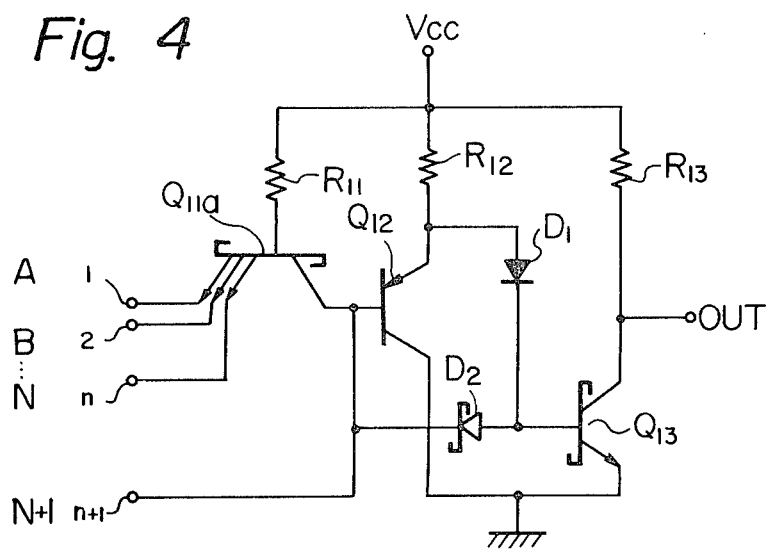
FIG. 4 is a schematic of a circuit of the logic circuit device according to another embodiment of the present invention.

For the purpose of removing the above-mentioned drawback the following measures are recommended:

(a) A multi-emitter transistor $Q_{11a}$ with a Schottky barrier diode is used in place of the usual multi-emitter transistor $Q_{11}$, as illustrated in FIG. 4. When the Schottky barrier diode is attached to the transistor $Q_{11a}$, the threshold voltage of the transistor decreases about 200 mV and a high operating speed can be obtained.

(b) Effects of the parasitic lateral PNP transistor $Q_3$ can be removed by using an oxide film without using the isolation diffusion regions. In this method, high speed can be obtained without decreasing the threshold voltage.

(c) The collector of the transistor $Q_{11}$ and the base of the transistor $Q_{12}$ are the same conductive type and have an identical potential. Therefore, these transistors can be formed in the same isolation region, so that the construction of the integrated circuit can be small in size.

In the embodiments explained above, a plurality of diodes may be substituted for the multi-emitter transistor as input means.

As mentioned above, according to the present invention, a small emitter current of the multi-emitter transistor can be used when the logic input level is low. Therefore, the voltage drop in the wires connected to the emitter is small and the margin of the threshold voltage to the inputs can be maintained.

I claim:

1. A logic circuit device comprising:
   input means operatively connected to receive an external electric source potential, and having a plurality of first terminals and having a second terminal, for receiving input signals at respective ones of said first terminals;
   a PNP transistor having a base connected to said second terminal of said input means and having an emitter operatively connected to receive said external electric source potential, and a collector operatively connected to ground;
   level shift means having a first terminal which is operatively connected to said emitter of said PNP transistor to receive a voltage and a second terminal, for providing a voltage at said second terminal having a level lower than said voltage received at said first terminal.
   an output transistor which has a base operatively connected to said second terminal of said level shift means, an emitter operatively connected to ground and a collector operatively connected to receive said external electric source potential; and
   an output terminal operatively connected to said collector of said output transistor.

2. A logic circuit device according to claim 1, further comprising an input terminal which is connected to said base of said PNP transistor.

3. A logic circuit device according to claim 1, wherein said input means comprises an multi-emitter transistor having a plurality of emitters for said first terminals, and having a base operatively connected to receive said external electric source potential, a base operatively connected to receive said electric source potential and a collector for said second terminal.

4. A logic circuit device according to claim 3, wherein said multi-emitter transmitter is formed as a Schottky barrier transistor.

5. A semiconductor, multi-input, logic circuit device comprising:
   an electrical source terminal operatively connected to receive an external electric source potential;
   input means, having a plurality of first terminals for receiving logic input signals, having a second terminal operatively connected to the electric source terminal, and having a third terminal;
   regulating means, having a first terminal operatively connected to said third terminal of said input means, having a second terminal connected to the electrical source terminal, and having a third terminal operatively connected to ground, for providing an output from said second terminal responsive to said logic input signals;
   level shift means, having a first terminal operatively connected to said second terminal of said regulating means to receive a voltage and having a second terminal, for providing a voltage at said second terminal responsive to said output of said regulating means and lower than said voltage received at said first terminal; and
   output means being activated by said level shift means, having a first terminal operatively connected to said second terminal of said level shift means, having a second terminal operatively connected to said electrical source terminal, and having a third terminal operatively connected to ground, for supplying output signals at said second terminal responsive to said voltage at said second terminal of said level shift means.

6. A device according to claim 5, wherein an additional input terminal is connected to said first terminal of said regulating means.

7. A device according to claim 5, wherein said device is formed as an integrated circuit.

8. A device according to claim 6, wherein said device comprises a NAND gate.

9. A device according to claim 5, 6, 7 or 8, wherein said input means comprises a multi-emitter transistor, having a plurality of emitters as said first terminals, a base as said second terminal, and a collector as said third terminal.

10. A device according to claim 9, wherein said multi-emitter transistor is a Schottky barrier transistor.

11. A device according to claim 9, wherein said multi-emitter transistor is selected to be one of: a NPN type and a PNP type.

12. A device according to claim 5, 6, 7, or 8, wherein said regulating means comprises a PNP-type transistor, having a base as said first terminal, an emitter as said second terminal connected to said electrical source terminal through a first resistor and connected to said first terminal of said level shift means, and a collector as said third terminal.

13. A device according to claim 5, 6, 7, or 8, wherein said output means comprises a NPN-type output transistor having a base as said first terminal, a collector as said second terminal connected to said electrical source terminal through a first resistor, and an emitter as said third terminal.

14. A device according to claim 13, wherein said NPN-type output transistor is a Schottky barrier transistor.

15. A device according to claim 13, wherein said device further includes a Schottky barrier diode having an anode operatively connected to said base of said NPN-type output transistor, and having a cathode operatively connected to said first terminal of said regulating means.

16. A device according to claim 5, 6, 7, or 8, wherein said input means comprises an NPN-type multi-emitter transistor having a plurality of emitters corresponding to said first terminals, a base corresponding to said second terminal and a collector corresponding to said third terminal;

said regulating means comprises a PNP-type transistor having a base corresponding to said first terminal, an emitter corresponding to said second terminal and a collector corresponding to said third terminal;

said output means comprises an NPN-type output transistor having a base corresponding to said first terminal, a collector corresponding to said second terminal and an emitter corresponding to said third terminal; and said PNP-type transistor has a threshold voltage at the base of said PNP-type transistor equal to the value of a voltage drop from said base to said emitter of said NPN-type output transistor.

17. A device according to claim 5, 6, 7, or 8, wherein said input means comprises an NPN-type multi-emitter transistor having a structure comprised of:

(a) a circuit substrate;
(b) a buried layer region formed in said circuit substrate;
(c) a collector region formed on said buried layer region and said circuit substrate, having an exposed surface, and having a contact region extending from the exposed surface of said collector region to said buried layer region;
(d) a base region formed in said collector region at the exposed surface of said collector region, and having a contact;
(e) a plurality of emitter regions separately formed in said base region, each said emitter region having a contact; and
(f) isolation regions formed in said circuit substrate and said collector region, enclosing with said circuit substrate a bounded region wherein said NPN-type multi-emitter transistor is contained.

18. A device according to claim 17, wherein said regulating means comprises a PNP transistor, said PNP-type transistor being contained in same said bounded region wherein said NPN-type multi-emitter transistor is contained.

19. A device according to claim 18, wherein said output means comprises an NPN-type output transistor.

20. A device according to claim 5, 6, 7 or 8, wherein said level shift means comprises a diode having an anode as said first terminal and connected to said second terminal of said regulating means, and having as said second terminal a cathode connected to said first terminal of said output means.

21. A device according to claim 18, wherein said level shift means comprises a diode.

* * * * *

UNITED STATES PATENT AND TRADEMARK OFFICE
CERTIFICATE OF CORRECTION

PATENT NO. : 4,445,052
DATED : April 24, 1984
INVENTOR(S) : Higashi

It is certified that error appears in the above-identified patent and that said Letters Patent is hereby corrected as shown below:

Front page, [57] ABSTRACT, line 2, delete "a".
Column 1, line 52, after "are" insert --respectively--;
line 53, after "(VCC)" insert --;--; delete "respectively".
Column 3, line 5, "terminal source" should be --source terminal--;
line 41, "$I_C(Q12)$" should be --$I_C(Q11)$--.
Column 4, line 54, "to the" should be --at--.
Column 5, line 68, "an" should be --a--.
Column 6, line 46, [claim 8, line 1.] "6" should be --5--.

Signed and Sealed this

Second Day of October 1984

[SEAL]

Attest:

GERALD J. MOSSINGHOFF

*Attesting Officer*      *Commissioner of Patents and Trademarks*